(12) United States Patent
Vu

(10) Patent No.: US 7,116,262 B1
(45) Date of Patent: Oct. 3, 2006

(54) SYSTEM AND METHOD TO RECEIVE DATA

(75) Inventor: Steven Vu, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/171,918

(22) Filed: Jun. 30, 2005

(51) Int. Cl.
*H03M 1/12* (2006.01)

(52) U.S. Cl. ........................... 341/155; 341/165

(58) Field of Classification Search ......... 341/150–170
See application file for complete search history.

(56) References Cited

U.S. PATENT DOCUMENTS

| | | | | |
|---|---|---|---|---|
| 5,465,011 A | * | 11/1995 | Miller et al. | 307/64 |
| 5,748,984 A | * | 5/1998 | Sugita | 710/69 |
| 6,145,083 A | * | 11/2000 | Shaffer et al. | 726/7 |
| 6,476,990 B1 | * | 11/2002 | Hansen | 341/155 |
| 6,477,595 B1 | * | 11/2002 | Cohen et al. | 710/105 |

\* cited by examiner

*Primary Examiner*—Lam T. Mai
(74) *Attorney, Agent, or Firm*—Jeffrey G. Toler; Toler Schaffer, LLP

(57) ABSTRACT

A system and method of receiving data is disclosed. The system includes an analog to digital converter, registers to store a plurality of digital samples provided by the analog to digital converter, and a state machine coupled to the registers. The state machine detects jitter or drift in at least one of the digital samples and provides a digital value for the digital sample based on at least one other of the plurality of digital samples. In a particular embodiment, the samples are each comprised of a plurality of data segments, and the state machine applies a virtual frame to the data segments of the digital sample and shifts the virtual frame to include at least one data segment of the other digital sample.

20 Claims, 3 Drawing Sheets

SYSTEM AND METHOD TO RECEIVE DATA

FIELD OF THE DISCLOSURE

The disclosure relates generally to systems and methods to receive data.

BACKGROUND

Electronic devices often receive and transmit data streams to other devices. These data streams may be transmitted in a variety of formats, such as the Universal Serial Bus (USB) format. In some cases, it may be advantageous for an electronic device receiving data streams to separate the received data into frames. However, received data streams may be subject to drift, jitter, or other inconsistencies that make it more difficult to for the receiving device to accurately identify the contents of each frame. These inconsistencies can corrupt the data stream and lead to loss of data or a degradation of performance.

Accordingly, there is a need for an improved system and method to receive digital data.

DETAILED DESCRIPTION OF THE DRAWINGS

A system and method of receiving data is disclosed. The system includes an analog to digital converter, registers to store a plurality of digital samples provided by the analog to digital converter, and a state machine coupled to the registers. The state machine detects jitter or drift in at least one of the digital samples and provides a digital value for the digital sample based on at least one other of the plurality of digital samples. In a particular embodiment, the samples are each comprised of a plurality of data segments, and the state machine applies a virtual frame to the data segments of the digital sample and shifts the virtual frame to include at least one data segment of the other digital sample.

The method includes receiving a digital data stream, storing a first sample of the digital data stream and storing a second sample of the digital data stream after storing the first sample. The first and second samples each include a plurality of data segments. The method further includes applying a virtual frame to the first sample by aligning a portion of the virtual frame with a first data segment of the first plurality of data segments and shifting the virtual frame.

Figure 1:
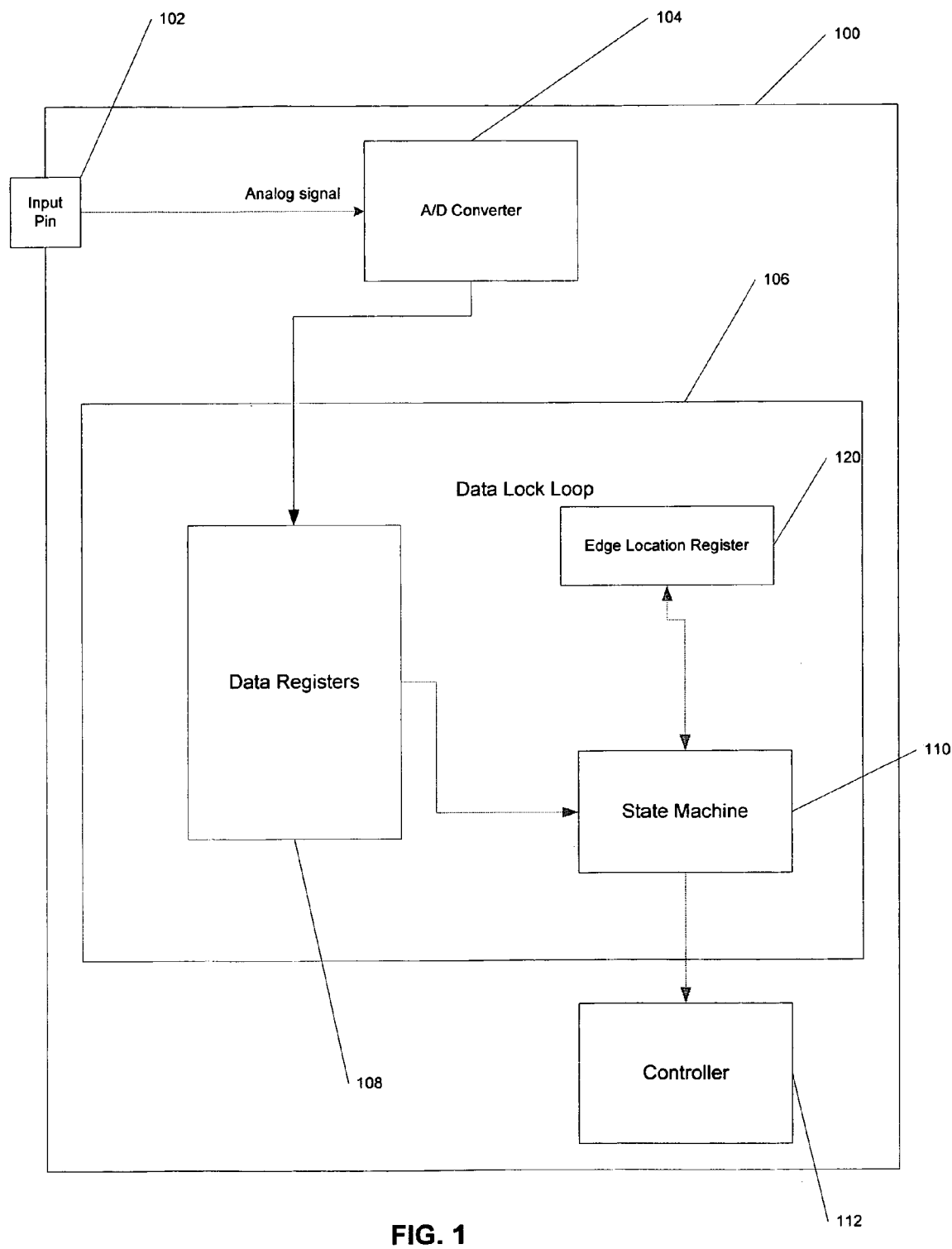
FIG. 1 is a block diagram of a particular embodiment of an integrated circuit for receiving a digital data stream.

In FIG. 1, a particular embodiment of an integrated circuit 100 that receives a digital data stream is illustrated. The integrated circuit 100 includes an input pin 102 coupled to an analog to digital converter 104. The analog to digital converter 104 is coupled to a data lock loop 106. The data lock loop 106 includes a set of registers 108 coupled to a state machine 110. The state machine 110 is further coupled to an edge location register 120. The data lock loop 106 is also coupled to a controller 112.

During operation, the integrated circuit 100 receives an analog signal at the input pin 102. In a particular embodiment, the input pin is configured to receive a signal compliant with the Universal Serial Bus (USB) standard. The analog signal is converted to a plurality of digital samples by the analog to digital converter 104. Furthermore, the registers 108 store the digital samples provided by the analog to digital converter 104. In a particular embodiment, the registers 108 store up to eight or ten digital samples at a time.

The state machine 110 can detect jitter and drift conditions with respect to the received digital data stream by evaluating the digital samples stored in the registers 108. In a particular embodiment, the state machine 110 can detect a jitter or drift condition by detecting an edge in one of the digital samples. The edge may be detected by detecting a transition in the digital values of the data segments of the digital sample. If the edge occurs after the beginning of a digital sample, this may indicate a drift or jitter condition that may be detected by the state machine 110. In response, the state machine 110 may apply a virtual frame to the digital sample. Furthermore, the state machine 110 may shift the virtual frame to compensate for the drift or jitter condition. In addition, the state machine 110 may adjust for a drift or jitter condition by using prior or subsequent digital samples derived from the received digital data stream that have been stored in the registers 108 to determine a value for a particular digital sample.

The state machine 110 may record the location of a detected edge in edge location register 120. The edge location register 120 may accumulate edge locations over several samples. Based on the contents of the edge location register 120, the state machine 110 may shift a virtual frame over one or more of the data registers 108.

The values for the digital samples as determined by the state machine 110 are provided to the controller 112. In a particular embodiment, the controller 112 may buffer the digital values provided by the state machine 110 to form a digital signal that is representative of the analog signal provided to the input pin 102. In a particular embodiment, the controller 112 may perform other functions, such as error correction or other processing. In a particular embodiment, the state machine 110 may be implemented as digital logic elements and the controller 112 may be a microprocessor.

Figure 2:
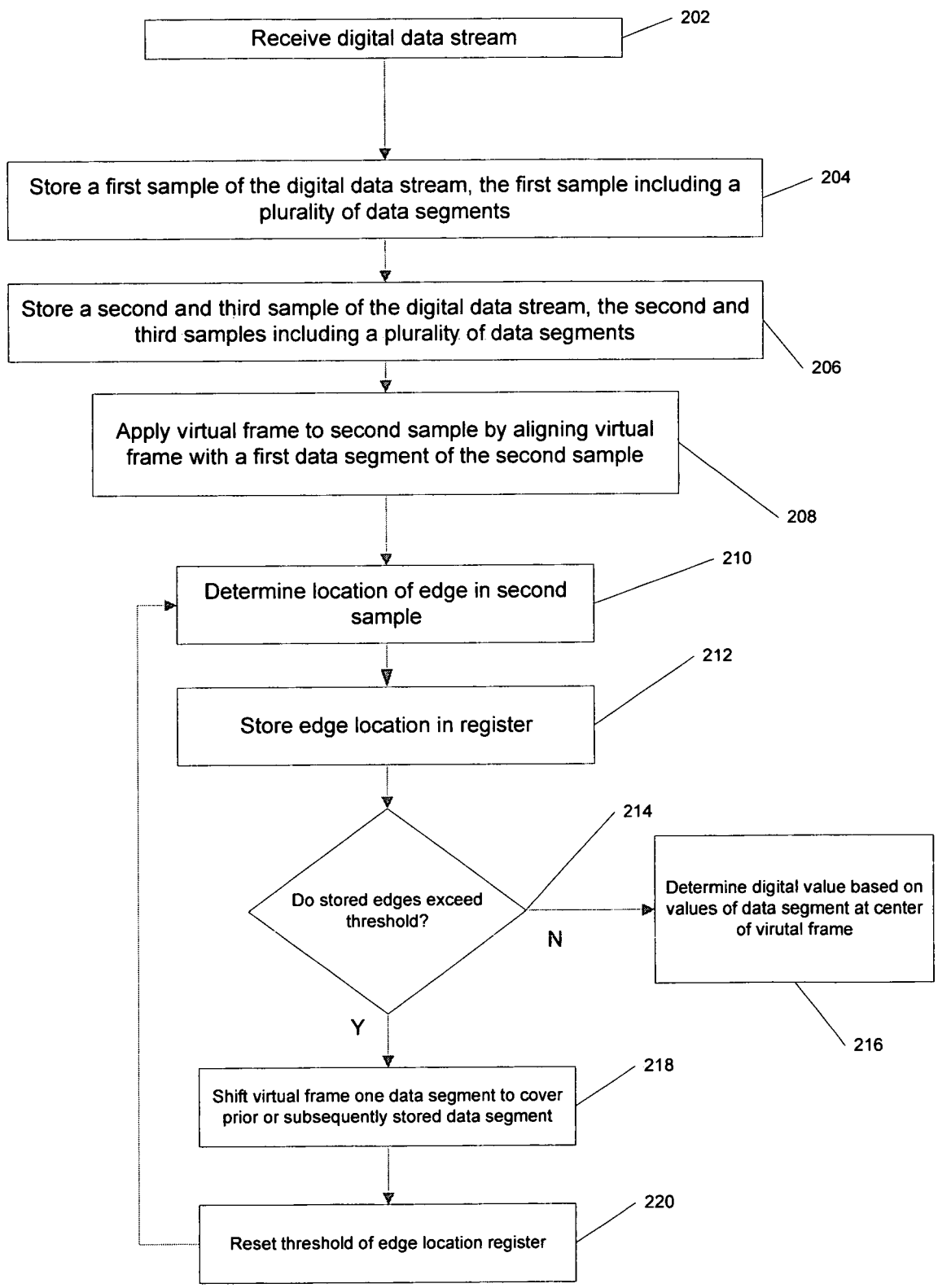
FIG. 2 is a flow chart of a method of applying a virtual frame to a plurality of digital samples of a received digital data stream.

Referring to FIG. 2, a method of determining a digital value based on use of a virtual frame is illustrated. In a particular embodiment, this method may be implemented by the system illustrated in FIG. 1. At step 202, a digital data stream is received. Proceeding to step 204, a first sample of the digital data stream is stored. The first sample includes a plurality of data segments. Moving to step 206, a second and third samples of the digital data stream are stored. The second and third samples, like the first, include a plurality of data segments.

Next, the method proceeds to step 208 and a virtual frame is applied to the second sample by aligning a virtual frame with a first data segment of the second sample. Proceeding to step 210, the location of an edge in the second sample is determined. By determining the location of an edge in the second sample, a drift condition is detected. Moving to step 212, the location of the edge is stored in a register. In a particular embodiment, the edge locations are accumulated in a register over several data samples. Proceeding to decision step 214, it is determined whether the edge locations stored in the edge location register exceed a threshold. In a particular embodiment, the threshold is exceeded when the edge location register indicates fewer than four continuous locations without an edge. If the stored edge locations do not exceed the threshold, the method moves to step 216 and a digital value for the first sample is determined based on the value of the data segments located at or near the center of the virtual frame.

Returning to decision step 214, if it is determined that the edges stored in the register do exceed the threshold, the method proceeds to step 218, and the virtual frame is shifted one data segment to cover a data segment of the previously stored first sample or the subsequently stored third sample. In effect, the shifted virtual frame addresses a detected drift condition. The method then proceeds to step 220, and the threshold of the edge location register is reset. In a particular embodiment, this is done by inserting a zero at the end of the edge location register. The method then moves to step 212. It will be appreciated that the virtual frame may be shifted multiple times, depending on the location of the edge in the first sample. In a particular embodiment, a second drift condition may be detected at step 212 after the virtual frame is shifted a first time. The virtual frame may be shifted a second time at step 218 after the second drift condition has been detected. At step 216, a digital value for the first frame may be determined based on data segments of the first and second sample associated with the twice-shifted virtual frame.

Figure 3A:
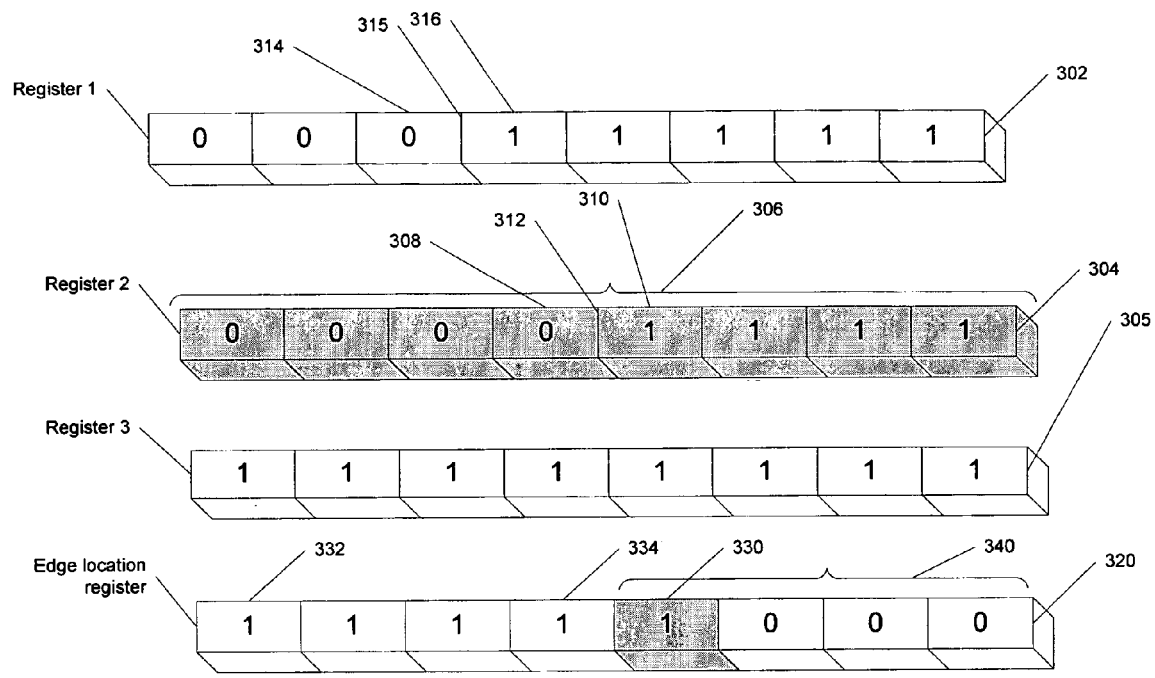
FIG. 3A is a general diagram that illustrates application of a virtual frame applied to a plurality of samples of a received digital data stream.

Referring to FIG. 3A, a virtual frame applied to a plurality of sampled data is illustrated. The illustration shows a first sample 302, a second sample 304, and a third sample 305. In a particular embodiment, the samples may be stored in a series of registers, such as the registers 108 illustrated in FIG. 1. In a particular embodiment, each sample may represent a frame of data from a digital data stream. As shown, the first sample 302, the second sample 304 and the third sample 305 are composed of a plurality of data segments, such as data segments 30, 310, 314 and 316. Also illustrated is an edge location register 320. The edge location register includes a plurality of data segments, such as locations 330, 332, and 334, to record the locations of edges detected in the samples 302, 304, and 305. For example, as illustrated, the transition of the binary data between the two data segments 314 and 316 forms an edge 316. The location of this edge has been recorded in data segment 334 of edge location register 320 by placing a value of "1" at that data segment. Further, an edge 312 is formed in the second sample 304 by the transition of the data at data segments 308 and 310.

During operation, a virtual frame 306 is applied initially to the second sample 304 as shown. As illustrated with respect to FIG. 2, the virtual frame 306 may be applied to the second sample 304 in response to detecting the edge 312.

In a particular embodiment, changes in the digital data stream coincide with the digital samples, and in this case there are no edges (represented by a change in the data segments of a digital sample) within the individual digital samples. Accordingly, in the absence of drift, jitter, or other errors, the data segments of each sample have the same binary values, as illustrated in the third sample 305. In a particular embodiment, the digital value for the second sample 304 would be the same as the value of the data segments of the second sample.

As illustrated, the second sample 304 includes the edge 312 in the sample indicating a drift condition. In response to detection of the drift condition, the virtual frame 306 is applied to the second sample 302 by aligning the beginning portion of the virtual frame 306 with the first data segment of the second sample 302. In a particular embodiment, a digital value for the sample 302 may be determined based on the value a data segments located at or near the center of the virtual frame 306.

As illustrated, after the edge 312 has been detected, the edge location is recorded at data segment 330 of the edge location register 320. The edge location register 320 includes a minimum area or "eye" 340. In a particular embodiment, the minimum area 340 is a series of four continuous "zeroes" in the edge location register 320. When the value "1" is recorded at data segment 330, this indicates that the drift condition has exceed a threshold by encroaching on the minimum area 340. In response, The virtual frame 306 is shifted to compensate for the drift or jitter condition.

Figure 3B:
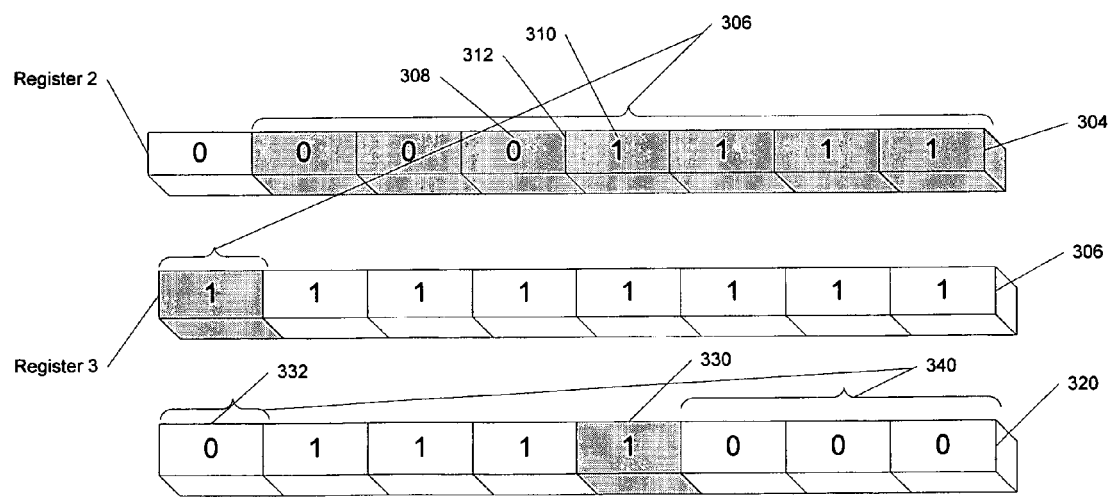
FIG. 3B is a general diagram that illustrates the plurality of samples of FIG. 3A after the virtual frame has been shifted.

Referring to FIG. 3B, the samples are illustrated after the virtual frame 306 has been shifted. As illustrated, the virtual frame 306 has been shifted to include a data segment from the third sample 306. The digital value for the first digital sample 302 may be determined based on the contents of the shifted virtual frame 306. In a particular embodiment, the digital value is based on the value the data segments at or near the center of the shifted virtual frame 306, including the one data segment of the second sample 304. Further, as illustrated the minimum area 340 has been shifted to include the segment 332 and the value of the segment 332 has been reset. This ensures that the virtual frame 306 is only shifted to compensate for the detected drift. Further, this ensures that the virtual frame 306 is properly aligned and shifted for subsequently recorded samples. In a particular embodiment, the moving of the minimum area 340 and resetting of the data segment 332 acts to reset the threshold for the edge location register 320.

The disclosed system and method can provide improved reception of a data stream by an electronic device. In certain applications, drift and jitter conditions may be compensated for by applying a virtual frame to a sample and shifting the virtual frame to compensate for the drift or jitter conditions. Further, drift and jitter may be compensated for by examining prior and subsequent samples to determine a value of a digital sample.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit comprising:
   an analog to digital converter;
   a plurality of registers to store a plurality of digital samples provided by the analog to digital converter;
   a state machine coupled to the plurality of registers, the state machine to detect jitter or drift in at least one of the plurality of digital samples, and to provide a digital value for the at least one of the plurality of digital samples based on at least one other of the plurality of digital samples; and
   wherein each of the plurality of samples is comprised of a plurality of data segments, and wherein the state machine applies a virtual frame to the data segments of the at least one digital sample and shifts the virtual frame to include at least one data segment of the at least one other digital sample.

2. The integrated circuit of claim 1, further comprising:
an edge location register coupled to the state machine to record a location of an edge in the at least one of the plurality of digital samples.

3. The integrated circuit of claim 1, further comprising:
an input pin coupled to the analog to digital converter, the input pin configured to receive a signal compliant with the Universal Serial Bus (USB) standard.

4. A method, comprising:
receiving a digital data stream;
storing a first sample of the digital data stream, the first sample including a first plurality of data segments;
storing a second sample of the digital data stream after storing the first sample, the second sample including a second plurality of data segments;
applying a virtual frame to the second sample by aligning a portion of the virtual frame with a first data segment of the second plurality of data segments; and
shifting the virtual frame.

5. The method of claim 4, further comprising:
detecting a drift condition of the digital data stream.

6. The method of claim 5, further comprising:
shifting the virtual frame a first time after detecting the drift condition.

7. The method of claim 6, further comprising:
detecting a second drift condition after shifting the virtual frame a first time.

8. The method of claim 7, further comprising:
shifting the virtual frame a second time after detecting the second drift condition.

9. The method of claim 5, further comprising:
determining a digital value based on data segments of the first and second sample associated with the shifted virtual frame.

10. The method of claim 5, further comprising:
providing the digital value to a controller.

11. The method of claim 4, further comprising detecting a drift condition of the digital data stream by locating an edge formed by a transition between two data segments of the first plurality of data segments.

12. The method of claim 11, wherein the virtual frame is shifted to include at least one data segment from the second plurality of data segments.

13. The method of claim 12, further comprising;
determining a digital value based on the data segments associated with application of the virtual frame after the virtual frame has been shifted.

14. The method of claim 13, wherein the digital value is determined based on a digital value of at least one of the data segments located near a center of the virtual frame.

15. The method of claim 11, further comprising storing the edge location in an edge location register.

16. The method of claim 15, wherein the virtual frame is shifted in response to the contents of the edge location register exceeding a threshold.

17. The method of claim 16, wherein the edge location register is reset after the virtual frame is shifted.

18. A method comprising:
storing a plurality of digital samples corresponding to a received digital data stream, wherein each of the plurality of digital samples is comprised of a plurality of data segments;
detecting a drift condition in the plurality of digital samples by detecting an edge in at least one of the plurality of digital samples;
applying a virtual frame to the at least one of the plurality of digital samples by aligning the virtual frame to include the data segments of the at least one digital sample;
shifting the virtual frame to include a data segment from at least one other of the plurality of digital samples in response to detecting the drift; and
determining a digital value of the at least one of the plurality of digital samples based on the contents of the data segments associated with the shifted virtual frame.

19. The method of claim 18, wherein the digital value is determined based on the value at least one of the data segements, the at least one of the data segments having a location near a center associated with the shifted virtual frame, the data segments including at least one data segment of the at least one other digital sample.

20. The method of claim 18, wherein the at least one other digital sample is stored subsequent to the at least one of the plurality of digital samples.

* * * * *